United States Patent [19]

Yamagami et al.

[11] Patent Number: 5,681,485
[45] Date of Patent: Oct. 28, 1997

[54] METHOD OF PRODUCING MULTILAYER CIRCUIT BOARDS

[75] Inventors: Yoshikazu Yamagami, Sennan; Shinji Seo; Akio Kashihara, both of Hirakata, all of Japan

[73] Assignee: Nippon Paint Co., Ltd., Osaka, Japan

[21] Appl. No.: 565,402

[22] Filed: Nov. 30, 1995

[30] Foreign Application Priority Data

Dec. 2, 1994 [JP] Japan .................... 6-329645

[51] Int. Cl.$^6$ .................... B44C 1/22; C23F 1/00
[52] U.S. Cl. .................... 216/13; 216/20; 216/43
[58] Field of Search .................... 216/13, 20, 18, 216/40, 43, 105–109; 427/96, 98

[56] References Cited

U.S. PATENT DOCUMENTS 3,832,176  8/1974  Verstraete et al. .................... 216/13 X
4,075,757  2/1978  Malm et al. .................... 216/18

*Primary Examiner*—William Powell
*Attorney, Agent, or Firm*—Pollock, Vande Sande & Priddy

[57] ABSTRACT

A method of producing multilayer circuit boardschar comprising repeating a procedure comprising the steps of (1) laminating a photosensitive film composition shaped in a film form onto an insulating material carrying a conductor pattern formed thereon, (2) exposing the laminated photosensitive film composition to light through a negative type photomask, (3) dissolving the domains not irradiated in the above exposure step, (4) heat-curing the domains not dissolved in step (3), (5) forming a copper plating layer on the surface of the photosensitive film composition heat-cured in step (4) by electroless copper plating with or without further electroplating of copper, and (6) forming, on the plated copper layer formed in step (5), a photosensitive etch resist layer and subjecting said layer to light exposure through a photomask having a circuit pattern drawn thereon, developing and etching to thereby form a conductor pattern, said photosensitive film composition for lamination containing at least 50% by weight of a bisphenol-epichlorohydrin type resin containing photosensitive functional groups and heat-curable functional groups.

18 Claims, No Drawings

METHOD OF PRODUCING MULTILAYER CIRCUIT BOARDS

INDUSTRIAL FIELD OF UTILIZATION

The present invention relates to a method of producing, by the build-up technique, multilayer boards which are printed circuit boards for use in the electronics industry in which the density of wiring is required to be high and the board size to be as small as possible.

PRIOR ART

With the advance in electronics technology, attempts have been constantly made to increase the wiring density and the operation speed in electronic equipment, for example computers. For achieving such purposes, use is currently made, in such equipment, of printed circuit boards which are multilayer boards comprising a plurality of wiring circuit-containing layers for the purpose of increasing the wiring density.

In multilayer circuit boards to be used in electronic equipment, a high level of electrical insulation is required between conductor layers since a decreae in insulation between conductor layers may lead to wrong signal transfer, hence wrong operation, the result being failure of the equipment to work normally. The recent trend toward lighter-weighted and smaller-sized circuit boards has made it more and more important for the electrical insulation ability of insulating layers to be maintained not only at the initial stage of operation but also during continuous use of the equipment. Furthermore, from the insulation durability viewpoint, it is required that the adhesion between insulating and conductor layers be firm.

In such multilayer circuit boards, conductor layers separated by an insulating layer are connected by means of a metal plated in through holes or a conductor filled in via holes. However, since these through holes or via holes are provided by drilling, there is a severe limitation on the reduction in diameter of these holes. Furthermore, for connecting two conductors separated by an insulating layer, it is necessary to provide through holes for all circuits and the thus-increased number of holes renders it difficult to increase the wiring density.

To overcome such difficulties, attempts have been made to produce multilayer circuit boards by the build-up technique. As an example of the art of producing multilayer circuit boards by the build-up technique, Japanese Kokoku publication Hei-04-55555 discloses a method of producing multilayer circuit boards which comprises repeating a procedure comprising applying, by using such a method as, for example, roller coating, curtain coating, screen printing, a mixture comprising a photosensitive resin which is slightly soluble in acid or oxidizing agent and at least one member of granular substance dispersed thereinto selected from a preliminarily cured heat-stable resin powder which is soluble in acid or oxidizing agent and an inorganic fine powder, to an insulating material carrying a conductor pattern formed thereon, drying the same, exposing the same to light through a photomask, dissolving the unexposed portions to effect hole formation and then subjecting the insulating layer to electroless plating.

In Japanese Kokai Publication Hei-02-143492, there is disclosed, in connection with the technology mentioned above, a technique which comprises causing hole formation by laser irrradiation.

PROBLEMS WHICH THE INVENTION IS TO SOLVE

However, the techniques mentioned above have drawbacks in that, with the increase in the wiring density of printed circuit boards, gas bubble formation tend to occur upon drying following application of liquid insulating materials, so that insulation deterioration may often result due to bubbles occurring in the insulating layer. If the insulation layer thickness is increased to ensure electric insulation, the tendency toward bubble formation rather increases and, as a result, the insulating property contradictorily diminishes with the lapse of time.

For the production of multilayer circuit boards by the build-up technique using bubble-free insulating films, Japanese Kokai publication Hei-05-136575 proposes a method which uses, for lamination, an insulating film having a specific composition in lieu of liquid resin compositions. By this method, however, long-term electrical insulation can be ensured only insufficiently since, among the essential components of the insulating film, namely an epoxy resin, a phenol resin, a thermoplastic resin and a cationic photopolymerization initiator, only the epoxy resin, which has a small molecular weight, is photo-cured by means of the cationic photopolymerization initiator while the other components, namely the phenol resin and thermoplastic resin, essentially have no photosensitive groups. Furthermore, in this technology, it is the epoxy resin alone that is involved in the curing reaction under light irradiation, while the other resins accounting for about 30 to 85% by weight are not involved in the photo-curing reaction; as a result, the pattern resolution on the occasion of development is very unsatisfactory, in addition, since the cationic polymerization product from the epoxy resin is a product of chain extension through ether bonding, the above insulating film is not necessarily good in adhesion to conductor patterns produced by coppper plating and, as far as its durability is concerned, the reliability is insufficient.

For ensuring the adhesion between an insulating layer and a conductor layer, a method is known according to which the mutual adhesion is increased, for example, by rendering the insulating layer, conductor layer or the like uneven by toughening treatment or the like. Japanese Kokoku Publication Hei-04-55555 discloses, as such a method, a technique which comprises bringing about the unevenness in question by dissolving particles contained in a photosensitive resin to thereby effect surface roughening. However, this technique requires the particles to have a property such that they are dissolved in the roughening solution but are not dissolved in the organic solvent in the ink composition. The particle composition is thus very limited. The use, as the roughening solution, of such a chemical as a strong acid or alkali is also disadvantageous.

For ensuring the adhesion by increasing the compatibility of the insulating layer with the substrate for lamination, Japanese Kokai Publication Hei-05-67881 proposes a method which comprises applying a liquid insulating material to the substrate surface carrying a conductor pattern formed thereon, followed by drying and lamination of a film-form insulating material. This method, however, requires application and drying of the liquid insulating material prior to lamination of the film-form insulating material and this makes the process complicated and inferior in productivity.

Accordingly, it is an object of the present invention to provide a method of producing multilayer circuit boards which are free of insulation-deteriorating bubbles, show excellent adhesion to conductor patterns without any particular roughening treatment, assure long-period electrical insulation and have insulating layers excellent in resolution at the time of development.

SUMMARY OF THE INVENTION

The gist of the present invention consists in that, a method of producing multilayer circuit boards characterized in that it comprises repeating a procedure comprising the steps of (1) laminating a photosensitive film composition shaped in a film-form onto an insulating material carrying a conductor pattern formed thereon, (2) exposing the laminated photosensitive film composition to light through a negative type photomask, (3) dissolving the domains not irradiated in the above exposure step, (4) heat-curing the domains not dissolved in step (3), (5) forming a copper plating layer on the surface of the photosensitive film composition heat-cured in step (4) either by electroless copper plating or by electroless copper plating and further forming thereon a plated copper layer with further electrodeposition, and (6) forming, on the plated copper layer formed in step (5), a photosensitive etch resist layer and subjecting said layer to light exposure through a photomask having a circuit pattern drawn thereon, developing and etching to thereby form a conductor pattern, said photosensitive film composition for lamination containing at least 50% by weight of a bisphenol-epichlorohydrin type resin containing photosensitive functional groups and heat-curable functional groups.

DETAILED DESCRIPTION OF THE INVENTION

The present invention is described in more detail in the following.

In accordance with the present invention, the insulating layers are formed by lamination of a photosensitive film composition containing a bisphenol-epichlorohydrin type resin as a photosensitive resin.

In the present specification, the term "bisphenol-epichlorohydrin type resin" is used not in a narrow sense but broadly means a resin comprising a unit resulting from ring-opening addition of epichlorohydrin to a bisphenol compound represented by the general formula (I)

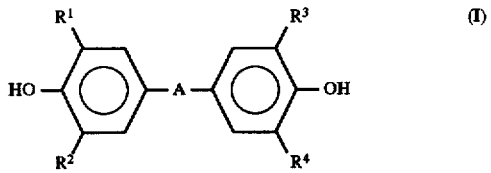

wherein $R^1$, $R^2$, $R^3$ and $R^4$ are the same or different and each represents a hydrogen atom, an alkyl group containing 1 to 4 carbon atoms or a halogen atom, and A represents —O—, —CH$_2$—, —C(CH$_3$)$_2$—, —CO—, —C(CF$_3$)$_2$—, —Si(CH$_3$)$_2$— or

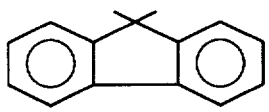

or means that the two phenyl groups are directly bound to each other.

In the photosensitive film composition mentioned above, the proportion of the above-mentioned bisphenol-epichlorohydrin type resin is at least 50% by weight. If said proportion is less than 50% by weight, the holes formed by photographic via hole formation will fail to be in good shape, leading to unsatisfactory reliability of interlayer conduction between the upper and lower conductor layers resulting from copper plating. Thus, the range mentioned above is critical.

The above-mentioned bisphenol-epichlorohydrin type resin may be any species provided that it has a large molecular weight and is photosensitive and thermally reactive. Preferred as such a species is a bisphenol-epichlorohydrin type resin containing (meth)acryloyl groups as photosensitive functional groups and carboxyl groups as heat-curable functional groups. The (meth)acryloyl group content in the bisphenol-epichlorohydrin type resin is 0.5 to 4 moles per kilogram. If the (meth)acryloyl group content is less than 0.5 mole per kilogram, the difference in solubility in the developer as resulting from light irradiation will be insufficient, hence the contrast will be poor. If said content is higher than 4 moles per kilogram, the crosslinking density resulting from the curing reaction will become excessively high and, as a result, the molecular weight between crosslinks will become small, so that the film will become rigid and brittle and the durability will be poor due to cracking resulting from changes in calorific value between the electric conduction period and the period of no electric conduction. The range of 0.6 to 3 moles per kilogram is preferred and the range of 0.8 to 2 moles per kilogram is more preferred.

The content of the carboxyl group in the (meth)acryloyl group-containing bisphenol-epichlorohydrin type resin is 0.5 to 2 moles per kilogram. If the carboxyl group content is below 0.5 mole per kilogram, the crosslinking density will be too low, causing decreases in insulation reliability and plating resistance. If said content is higher than 2 moles per kilogram, the crosslinking density will become excessively high, deteriorating the durability of multilayer circuit boards and the adhesion to the copper plating. The range of 0.7 to 1.5 moles per kilogram is preferred.

The (meth)acryloyl group-containing bisphenol-epichlorohydrin type resin mentioned above has a weight average molecular weight of 3000 to 20,000. If said weight average molecular weight is less than 3000, the shape of films formed will be difficult to maintain. If said molecular weight exceeds 20,000, the unirradiated portions will not be dissolved in the developer, leading to deterioration in contrast. The range of 4000 to 15,000 is preferred and the range of 5000 to 10,000 is more preferred.

The content of the (meth)acryloyl group-containing bisphenol-epichlorohydrin type resin is preferably within the range of 50 to 85% by weight on the solid content basis. If said content is smaller than 50% by weight, the photographically formed via holes will not be in good shape, the reliability of interlayer conduction between upper conductor layer and lower conductor layer resulting from copper plating will be insufficient. If said content exceeds 85% by weight, the flexibility will be poor.

In cases where the above-mentioned (meth)acryloyl group-containing bisphenol-epichlorohydrin type resin is used in the practice of the present invention, a curing reagent is used for providing heat curing reactivity. Said curing reagent is not limited to any particular species but includes, for example, phenol novolak type epoxy resins, cresol novolak type epoxy resins, biphenyl type epoxy resins, epxoy resins or compounds containing one or more epoxy groups, such as triglycidyl isocyanurate, hydroxyalkylamide compounds and so forth.

The above-mentioned curing reagent is used preferably in an amount of 5 to 20% by weight. If the addition level is lower than 5% by weight, the heat durability and insulating ability will be poor. If it exceeds 20% by weight, the insulation ability will be deteriorated.

When the (meth)acryloyl group-containing bisphenol-epichlorohydrin type resin mentioned above is used, a photosensitive monomer and a photopolymerization initiator are further added to the photosensitive film composition mentioned above.

The photosensitive monomer serves to adjust the contrast, improve the photosensitivity, adjust the crosslinking density and adjust the flexibility in the step of film forming, among others. The photosensitive monomer is not limited to any particular species provided that it is a compound having at least one (meth)acryloyl group. Thus, there may be mentioned, for example, mono(meth)acrylates such as methyl (meth)acrylate, ethyl (meth)acrylate, butyl (meth) acrylate, hydroxyethyl (meth)acryalte and (meth)acrylic acid: di(meth)acrylates such as ethylene glycol di(meth) acrylates and neopentyl glycol di(meth)acrylate; and polyfunctional (meth)acrylates such as trimethylolpropane tri (meth)acrylate, pentaerythtirol tetra(meth)acrylate, dipentaerythritol hexa(meth)acrylate and acrylic oligomers.

The above photosensitive monomer is added preferably in an amount of 5 to 35% by weight. If the addition level is below 5% by weight, insufficient contrast, poor sensitivity, insufficient flexibility and the like will result. If said level exceeds 35% by weight, the film will be tacky and difficult to maintain the shape thereof and become a rigid and brittle one.

The photopolymerization initiator is not limited to any particular species but includes, among others, benzoins such as benzoin, benzoin methyl ether and benzoin isopropyl ether, acetophenones such as acetophenone, diemthoxyphenylacetophenone and dichloroacetophenone; anthraquinones such as methylanthraquinone and amylanthraquinone; thioxanthones and others known in the art. These may be used in combination with a known photopolymerization accelerator such as a benzoic acid compound or a tertiary amine compound.

The photopolymerization Initiator mentioned adore is used preferably in an amount of 1 to 10% by weight. At addition levels below 1% by weight, the desired effect will not be produced while addition levels above 10% by weight are uneconomical.

When the (meth)acryloyl group-containing bisphenol-epichlorohydrin type resin mentioned above is used, the use of any organic solvent for maintaining the film characteristics is not needed since most of the photosensitive monomers are liquid. However, an organic solvent may be used as desired.

In the practice of the present invention, an inorganic filler is added to the above photosensitive film composition. Said inorganic filler serves to improve the heat durability, adhesion and flexibility and the peel strength of the copper plating. The inorganic filler is not limited to any particular species but includes, for example, barium sulfate, silica, zircon, calcium carbonate, alumina, talc and the like.

The level of addition of said inorganic filler is preferably 3 to 30% by weight. If the addition level is below 3% by weight, the heat durability as well as the peel strength of the copper plating will be insufficient. Conversely, if said level is above 30% by weight, improved heat durability will be obtained but the particulate inorganic material dispersed in the photosensitive film composition will cause a decrease in photosensitivity, causing failure of the photographically formed via holes to attain a good cylindrical shape. In addition, the resulting decreased resin proportion will result in a decrese in copper plating peel strength and/or a tendency toward cracking due to the film becoming extremely rigid.

In the practice of the present invention, an organic gel may be used in combination with the inorganic filler mentioned above for improving the heat durability, adhesion and flexibility. As said organic gel, there may be mentioned acrylic gel particles, vinyl gel particles and the like as prepared by using a polyfunctional crosslinkable monomer for copolymerization in a reaction for synthesizing organic resin particles, for example emulsion polymerization, suspension polymerization or dispersion polymerizaiton, followed by drying or solvent substitution using an appropriate organic solvent.

In the practice of the present invention, a surface modifier may further be added to the photosensitive film composition mentioned above. The surface modifier serves to avoid inclusion of air bubbles, poor leveling and the like and ensure the insulating ability and dimensional precision of the insulating layers. The surface modifier is not limited to any particular species but includes, among others, fluoride, silicone or acrylic antifoams or leveling agents.

The surface modifier is used preferably in an amount of 0.05 to 2% by weight based on the solid content of the photosensitive film compositon. At addition levels below 0.05% by weight, said modifier cannot produce its effects while, at levels exceeding 2% by weight, pinholes are formed and/or foaming occurs.

In the practice of the present invention, multilayer circuit boards can be produced by building up a plurality of circuit layers by repeating a procedure comprising the steps of (1) laminating a photosensitive film composition shaped in a film-form on an insulating material carrying a conductor pattern formed thereon, (2) exposing the laminated photosensitive film composition to light through a negative type photomask, (3) dissolving the domains not irradiated in the above exposure step, (4) heat-curing the domains not dissolved in step (3), (5) forming a copper plating layer on the surface of the photosensitive film composition heat-cured in step (4) either by electroless copper plating or by electroless copper plating and further forming thereon a plated copper layer with further electrodeposition, (6) forming, on the plated copper layer formed in step (5), a photosensitive etch resist layer and subjecting said layer to light exposure through a photomask having a circuit pattern drawn thereon, developing and etching to thereby form a conductor pattern.

In the step (1) mentioned above, the above-mentioned photosensitive film composition shaped in a film-form is laminated on an insulating material carrying a conductor pattern formed thereon in advance. Said insulating material is not limited to any particular species. Thus, those that are generally used, for example glass epoxy plates, can suitably be used.

The photosensitive film composition shaped in a filmform is obtained by applying the above-mentioned photosensitive film composition to a base material, followed by drying. The base material is not limited to any particular species. From the viewpoint of strength and mold release, polyester films, such as polyethylene terephthalate films, for instance, can suitably be used.

The photosensitive film composition is adjusted to an appropriate viscosity using an organic solvent and then applied to such a base material. The photosensitive film composition can be prepared by blending ingredients by a conventional method. The application can be carried out in the conventional manner using a roll coater, spray coater, knife coater, die coater, lip coaxer, etc. The drying can be effected by evaporating the organic solvent to substantially zero or a predetermined level using a hot air drying oven, infrared drying oven or the like. After the drying, the coated base material, which is in a slightly sticky state, is taken up via a film thickness adjusting roll. On this occasion, the dried film is preferably covered with a release film or paper. A polyethylene film can suitably be used as the release film.

The thickness of the photosensitive film composition shaped in a film-form as mentioned above may vary depending on the thickness of the conductor pattern and other factors. Generally, however, a dry thickness of 40 µm to 100 µm is preferred. A thickness less than 40 µm will result in inferior insulation reliability, while a thickness exceeding 100 µm will render the multilayer circuit boards excessively thick.

In the above-mentioned step (1), the photosensitive film composition shaped in a film-form is laminated onto the insulating material. The lamination can be performed using an apparatus generally used in the art, for example a vacuum laminating machine. For attaining perfect film lamination onto the conductor pattern voids, the film is preferably softened to some extent by heating the substrate and/or film combinedly using a heating system. A heating roll, for instance, may be used as the heating system.

In the practice of the present invention, it is also possible, in step (1), to dissolve the photosensitive film composition in an appropriate solvent to give an ink and applying the ink to the insulating material and dry the same prior to lamination of the photosensitive film composition shaped in a film-form to thereby further increase the adhesion to the insulating material carrying a conductor pattern formed thereon and eliminate corner vacancies, followed by the lamination mentioned above. The ink-like photosensitive film composition preferably has a viscosity of 10 to 300 poises so that the conductor circuit gaps can be filled up with the photosensitive ink.

In the practice of the present invention, a step of drying the photosensitive film composition thus laminated may be inserted between the steps (1) and (2) mentioned above.

In the step (2) mentioned above, the laminated photosensitive film composition is exposed to light through a negative type photomask. The exposure can be effected with a sufficient quantity of light to catalyze the photopolymerization reaction of the photosensitive film composition, using a high-pressure mercury lamp, ultrahigh-pressure mercury lamp, metal halide lamp or the like. The negative type photomask may be one in common use. Thus, for example, a photomask prepared by projecting an original silver salt photograph onto a photosensitive emulsion layer as applied to a polyester film, followed by developing and hardening can suitably be used.

In the above-mentioned step (3), the domains unirradiated during the above light exposure are developed by dissolution. The developer to be used in the developing is not limited to any particular species provided that it will not dissolve the exposed domains but dissolves the unirradiated domains to photographically form via holes. Those that evaporate at a temperature below the heat curing temperature of the photosensitive film compopsition and will not remain in the insulation layers after drying are preferred. As the developer to be used when the (meth)acryloyl group-containing bisphenol-epichlorohydrin type resin mentioned above is used, there may be mentioned a weakly alkaline solution containing sodium carbonate, sodium metasilicate or the like.

In the above-mentioned step (4), the domains not dissolved in step (3) are heat-cured. The heat curing can be effected using a hot air circulation drying oven, infrared drying oven, far-infrared drying oven or the like.

In the above-mentioned step (5), the photosensitive film composition heat-cured in step (4) is provided with a copper plating layer formed by electroless copper plating. The electroless copper plating can be performed in the conventional manner on the heat-cured insulation layer surface as surface-treated by polishing and for chemical etching. In this case, the polishing is preferably effaced by buffing, sandering, jet scrubbing or some other physical means and, for the above-mentioned chemical etching, an oxidizing agent such as permanganic acid or chromic acid can suitably be used.

In the above-mentioned step (5) of another mode of the present invention, the photosensitive film composition heat-cured in step (4) is provided with a copper plating layer formed by electroless copper plating, and then further a plated copper layer is formed on the copper plating layer by electrodeposition. The electrodeposition copper plating can be performed in the conventional manner on the surface of the initially formed electroless copper plating layer.

In the above-mentioned step (6), a conductor pattern is formed on the copper plating layer formed in step (5). The conductor pattern mentioned above can be formed in the conventional manner, for example by forming an etch resist, then forming a copper pattern by etching with an acid and peeling off the etch resist. In this case, the etch resist mentioned above is preferably a photosensitive one and, after formation of a photosensitive layer, a conductor pattern is formed by exposing said photosensitive layer to light through a photomask carrying the circuit pattern drawn thereon, followed by developing and etching. Thereafter, the photosensitive etch resist is peeled off.

In the practice of the invention, multilayer circuit boards having a desired number of circuit layers can be produced by repeating the above steps (1) to (6).

In another mode of practice of the present invention, the above-mentioned bisphenol-epichlorohydrin type epoxy resin to be used contains chalcone as the photosensitive functional group and an epoxy group as the heat-curable functional group. Said chalcone has a characteristic such that functional groups of the same kind, when subjected to light-induced radical reaction, react with each other and thus undergoes photopolymerization. The content of said chalcone in the bisphenol-epichlorohydrin type epoxy resin is 0.1 to 1 mole per kilogram. If the chalcone content is less than 0.1 mole per kilogram, the photocrosslinking reaction will hardly proceed and fail to provide a required contrast. If said content is higher than 1 mole per kilogram, intermolecular-crosslinking will tend to become difficult to attain and the film formed from said composition will be too rigid and show decreased flexibility, deteriorating the durability of multilayer circuit boards. The range of 0.2 to 0.8 mole per kilogram is thus preferrd and the range of 0.3 to 0.7 mole per kilogram is more preferred.

When the above-mentioned chalcone-containing bisphenol-epichlorohydrin type epoxy resin is used, an acrylic monomer or acrylic oligomer, which is a usual means in photosensitive resin compositions in general, cannot be used as a blend component because of a large difference in reaction rate between them.

The content of said epoxy group in the chalcone-containing bisphenol-epichlorohydrin type epoxy resin is 0.5 to 1.5 moles per kilogram. If the epoxy group content is below 0.5 mole per kilogram, the crosslinking density will be too low, leading to dereased insulation reliability and plating resistance. At levels above 1.5 moles per kilogram, the crosslinking density will become extremely high, deteriorating the durability of multilayer circuit boards and the adhesion thereof to the copper plating. The range of 0.6 to 1.2 moles per kilogram is thus preferred and the range of 0.7 to 1.0 mole per kilogram is more preferred.

The chalcone-containing bisphenol-epichlorohydrin type epoxy resin mentioned above has a weight average molecular weight of 8000 to 40,000. If the weight average molecular weight is less than 8000, the picture image formed by light-irradiated portions becoming insoluble in the developer owing to the polymerization reaction and unirradiated portions remaining soluble will have poor contrast. If the weight average molecular weight exceeds 40,000, unirradiated portions will not be dissolved in the developer, hence poor contrast will result. The range of 10,000 to 30,000 is preferred and the range of 12,000 to 20,000 is more preferred.

The proportion of said chalcone-containing bisphenol-epichlorohydrin type epoxy resin in the photosensitive film composition is preferably within the range of 50 to 80% by weight. If said proportion is less than 50% by weight, the holes formed by photographic via hole formation will fail to be in good shape, leading to unsatisfactory reliability of interlayer conduction between upper conductor layer and lower conductor layer resulting from copper plating. In proportions exceeding 80%, the resulting decreased inorganic filler and organic solvent contents will result in insufficient flexibility. The range of 55 to 75% by weight is more preferred.

In the cases where the above-mentioned chalcone-containing bisphenol-epichlorohydrin type epoxy resin is used in the practice of the present invention, an organic solvent may be added to the photosensitive film composition. Said organic solvent is used to reduce the rigidity of the film formed by the photosensitive film composition and provide the film with adequate flexibility to thereby avoid the trouble of film cracking. Furthermore, at the time of lamination of the film onto a substrate carrying a conductor pattern, said solvent also promotes the entry of the film into the pattern and thus increases the adhesion of the film to the substrate. The organic solvent is not limited to any particular species provided that it can dissolve the bisphenol-epichlorohydrin type resin mentioned above. Preferred, however are organic solvents which have slow volatility so as not to easily evaporate from the film but can evaporate without substantially remaining in the film during the heat-curing reaction and which will not reduce the insulating ability of the film. Among them, those having a boiling point of about 160° to 270° C. are preferred. As such organic solvents, there may be mentioned, for example, diethylene glycol monomethyl ether, diethylene glycol dimethyl ether, diethylene glycol butyl ether, gamma-butyrolactone, triethylene glycol dimethyl ether, propylene glycol methyl ether acetate and propylene glycol propyl ether.

The level of addition of the organic solvent is preferably 10 to 30% by weight. If the addition level is lower than 10% by weight, the flexibility and the adhesion at the time of lamination cannot be assuredly attained. At levels exceeding 30% by weight, the film form will become difficult to maintains and the tensile strength at the time of lamination will be low, resulting in breaking halfway, hence in defects.

In the practice of the present invention, a heat curing agent which is reactive, in the manner of addition reaction, with the epoxy group, a heat curing catalyst, a surface modifier and/or the like may further be added to the photosensitive film composition mentioned above.

Preferred as the heat curing agent capable of addition reaction with the epoxy group it a latent hardener with which the reaction proceeds only upon heating at a relatively high temperature. Those hardeners, crosslinking agents or the like that show a high reaction rate and are generally used for the curing reaction with the epoxy group are unsuitable for use in the practice of the present invention, in which an epoxy resin film is used, since they require the epoxy resin to be of the two component type. They are undesirable from the storage stability viewpoint as well.

As the latent hardener, there may be mentioned, for example, dicyanodiamide, Lewis acid complexes, imidazole compounds, organic acid hydrazides, diaminomaleonitrile, melamine and its derivatives, polyamine salts, microencapsulated hardeners and other known ones.

The addition level for the above-mentioned heat curing agent capable of addition reaction with the epoxy group is selected depending on the proportion and reaction equivalent of the epoxy resin. Generally, however, a level within the range of 2 to 8% by weight is preferred. At an addition level below 2% by weight, the heat curing reaction will not proceed to a sufficient extent, giving poor heat durability and insulation. At levels above 8% by weight, the content of the residues of the hardener increases and the insulation characteristics are deteriorated since the hardner reactive with the epoxy group is generally a polar compound.

The latent hardener may be used in combination with a heat curing catalyst. The heat curing catalyst is not limited to any particular species but includes, for example, urea derivatives such as phenyldimethylurea, tertiary amine salts and imidazole.

The heat curing catalyst is used preferably in an amount of 0.05 to 2% by weight.

In the cases where the above-mentioned chalcone-containing bisphenol-epichlorohydrin type epoxy resin is used in the practice of the present invention, after the above-mentioned step (2) but before the step (3), a step of drying by evaporating the organic solvent in the photosensitive film composition laminated as mentioned above may be inserted as necessary so that the rate of development or the shape of via holes to be photographically formed can be adjusted or corrected. In this case, the conditions of drying are preferably such that the temperature and time are sufficient to cause evaporation of the organic solvent in the photosensitive film composition but the temperature will not cause heat curing of the photosensitive film composition. The time and period may be varied depending on the photosensitive film composition and the organic solvent contained therein. Generally, however, a temperature of 60° to 100° C. and period of about 15 to 60 minutes are sufficient. The lower the temperature is, the longer the drying time required is. The higher the temperature is, the shorter is the drying time required. However, a higher temperature may cause heat curing reactions, hence becoming the composition insoluble in the developer.

In the above drying, the base material for the photosensitive film composition must have been peeled off.

As such developers to be used in the above-mentioned step (3) in cases where a chalcone-containing bisphenol-epichlorohydrin type epoxy resin is used, there may be mentioned, for example, ether alcohols such as the methyl ether, ethyl ether or ethyl ether acetate of ethylene glycol; the methyl ether, dimethyl ether, ethyl ether, diethyl ether, butyl ether or dibutyl ether of diethylene glycol; the methyl ether or dimethyl ether of triethylene glycol; the methyl ether, dimethyl ether, ethyl ether or ethyl ether acetate of propylene glycol; and other alcohols; lactones such as gamma-butyrolactone, epsilon-caprolactone, etc.; amides such as dimethylformamide and dimethylacetamide; and so forth. These may be used combinedly as a mixture of two or more.

In the practice of the present invention, insulating layers excellent in electric insulation and capable of maintaining good adhesion to conductor patterns over a prolonged period of time can be laminated, without any particular surface toughening treatment, by using the photosensitive film composition containing a high molecular weight bisphenol-epichlorohydrin type resin and an inorganic filler in accordance with the formulation mentioned above. Furthermore, the photosensitive film composition according to the recipe mentioned above can be molded into films excellent in moldability, mold release property, transferabiltity and storability, so that bubble-free insulating layers can be laminated and, in addition, it becomes possible to satisfy the photosensitivity and chemical resistance requirements, in particular the resistance to electroless copper plating, as imposed in producing multilayer circuit boards by the build-up technique.

The present invention can thus provide, with high productivity, multilayer circuit boards which are free of bubbles which lead to reduced insulation, are excellent in adhesion to conductor patterns without any particular roughening treatment, and assuredly have electric insulation ability lasting over a long period of time and have insulating layers excellent in resolution at the time of developing.

EXAMPLES

The following examples illustrate the present invention in further detail but are by no means limitative of the scope of the present invention.

Example 1

Ten parts by weight of propylene glycol methylether, 4 parts by weight of R-972 (ultrafinely divided silica; product of Nippon Aerosol Co.), 6 parts by weight of Finesil T-32 (finely divided silica; product of Tokuyama Corp.) and 0.1 part by weight of BYK-070 (silicone antifoam; product of BYK Chemie) were admixed with 90 parts by weight of a mixed-solvent varnish (solid content: 55% by weight) comprising a bisphenol-epichlorohydrin type epoxy resin having a weight average molecular weight of 15,000, a chalcone content of about 0.54 mole per kilogram and an epoxy content of about 0.54 mole per kilogram in (A) triethylene glycol dimethyl ether and (B) propylene glycol methyl ether acetate (A/B=18/27) and dispersion was effected to a particle size not more than 10 μm in a ceramic-coated three-roll mill. A separately prepared solution of 1 part by weight of dicyanodiamide in 4 parts by weight of dimethylacetamide was admixed with the above dispersion, followed by further addition of 5 parts by weight of propylene glycol methylether. The resultant mixture was applied to a 25 μm-thick polyester film to a film thickness of about 130 μm using a lip reverse coater and then dried in a tunnel oven adjusted to 60° to 100° C. for about 2 minutes. The solid content of the dried film was 79% by weight. A polyethylene film having a thickness of 30 μm was laminated onto the above film while it was still warm, and the laminate was taken up onto a plastic tube having a diameter of 3 inches through a roll with an adjusted clearance. Thus was obtained a film carrying an about 80 μm-thick photosensitive composition film.

A glass-epoxy insulating material with a conductor pattern preliminarily formed thereon was heated by passing through an externally heated roll set at 150° C. and then laminated, on both sides thereof, with the photosensitive composition film obtained as mentioned above after preliminary peeling off of the polyethylene cover film, while bringing in contact with a roll set at 50° C., using a vacuum laminater. After cooling the substrate thus laminated, a negative photomask for photographically forming via holes was placed on the polyester base film and the photosensitive film composition was exposed to light at 3000 mJ/cm$^2$ using a metal halide lamp exposure apparatus. The polyester base film was peeled off from the photosensitive film composition and the substrate was dried by allowing to stand in a drying oven set at 90° C. for 30 minutes and then the unexposed portions were dissolved using gamma-butyrolactone. After washing with water, it was allowed to stand in a drying oven at 80° C. for 20 minutes for removing moisture. This substrate was heat-cured in a drying oven at 140° C. for 90 minutes. There were found photographically formed via holes having a good bowl shape with a diameter of about 150 μm at the top and a diameter of 100 μm at the bottom.

The surface of the heat-cured photosensitive film composition was conditioned by buffing off about 7 μm and then subjected to solvent swelling and chemical etching by the conventional desmearing treatment technique and further to electroless plating, whereupon a copper foil about 0.3 μm in thickness was formed. The copper foil was subjected to electric copper plating and thus a plated copper layer about 20 μm in total thickness was obtained.

A photosensitive etch resist (Photo ED System P-1000; product of Nippon Paint) was formed on the copper plating, then light exposure was performed using a pattern mask for copper circuit formation, followed by developing, etching and resist peeling off, whereby a second layer conductor pattern was formed on the photosensitive film composition. The photosensitive film composition lamination step and subsequent steps are repeated in the same manner as mentioned above to thereby form a third layer conductor pattern. Thereafter, a solder resist was applied thereto. Thus was produced a multilayer circuit board comprising a total of 6 layers. The conduction between the circuits was perfect.

Separately, test boards were produced by increasing the total copper plating thickness to 35 μm in the step of copper plating following surface adjustment of the photosensitive film composition. Cuts were made on the plated copper foil with a width of 10 mm. The adhesion strength between the plated copper foil and photosensitive film composition was measured by peeling off at 90° on a tensile tester and found to be 1200 g/cm.

Further, separately, a comb-shaped IPC pattern was formed by etching the plated copper foil on the photosensitive film composition and then, repeating the step of laminating the photosensitive film composition and the subsequent steps in the same manner, a comb-shaped IPC pattern quite identical to that in the underlying layer was formed in the everlying layer as well without photographically making via holes through the photosensitive film composition so that the comb patterns lay on top of each other. A solder resist was applied onto the pattern in the upper-most layer and then a direct-current voltage of 30 V was applied to the upper layer and lower layer comb-shaped patterns and the board in that state was set on a pressure cooker tester adjusted to 121° C., 2 atm. and 85% RH and insulation reliability testing was performed. The resistance between the upper and lower layers was initially 8×10$^{13}$ Ω and, after the lapse of 300 hours, the resistance was 3×10$^8$ Ω. These data indicated that the insulation reliability was quite problem-free from the practical viewpoint.

Example 2

A photosensitive composition film having a solid content of 84% by weight and a film thickness of about 75 μm was prepared following the procedure of Example 1 for preparing the photosensitive film composition but conducting the drying in the tunnel oven for 150 seconds.

The procedure of Example 1 was then exactly followed repeatedly using the above film except that the heating roll for warming the photosensitive composition film after peeling off of the polyethylene cover films was set to a temperature of 100° C. A 6-layer circuit board similar to that of example 1 was thus obtained.

The results of testing for peeling strength of the plated copper foil and photosensitive film composition and of insualtion reliability testing were substantially the same as those obtained in Example 1.

Example 3

A 6-layer circuit board similar to that of Example 1 was obtained by following the procedure of Example 1 except that the step of subjecting the substrate laminated with the photosensitive composition film to light exposure, drying and developing for the photographic formation of via holes was modified such that the polyester base film was peeled off prior to exposure to light, the photosensitive film composition was dried at 90°C. for 30 minutes and then exposed to light in direct contact with the negative photomask, followed immediately by developing using gamma-butyrolactone.

The results of testing for peeling strength of the plated copper foil and photosensitive film composition and of insulation reliability testing were substantially the same as those obtained in Example 1.

Example 4

A mixture of 100 parts by weight of a propylene glycol propyl ether varnish containing a bisphenol-epichlorohydrin type epoxy resin (solid content: 75% by weight) having a weight average molecular weight of 6000, an acryloyl group content of about 2.5 moles per kilogram and a carboxyl group content of about 1.2 moles per kilogram, 25 parts by weight of propylene glycol methyl ether, 36 parts by weight of barium sulfate; 5.5 parts by weight of R-972 (ultrafinely divided silica: product of Nippon Aerosil), 40 parts by weight of dipentaerythritol hexa acrylate, 15 parts by weight of triglycidyl isocyanurate, 10 parts by weight of bis(N,N-dihydroxyethyl)adipamide, 2 parts by weight of Irgacure 907 (photopolymerization initiator; product of Ciba-Geigy) and 0.5 part by weight of BYK-070 (silicone antifoam; product of BYK Chemie) was processed in a ceramic-coated sand grind mill to attain dispersion to a particle size of not more than 10 µm. This dispersion was applied, using a die coater, to a 25 µm-thick polyester film to a film thickness of about 110 µm and dried in a tunnel oven adjusted to 50° to 100° C. for about 1 minute. Substantially no organic solvent was detected in the dried matter. While it was still warm, the film-shaped matter was laminated with a 30 µm-thick polyethylene film and the laminate was taken up on a plastic tube having a diameter of 3 inches via a roll with an adjusted clearance. A photosensitive composition film having a thickness of about 70 µm was thus obtained.

A glass-epoxy insulating material with a conductor pattern preliminarily formed thereon was heated by passing through an externally heated roll set at 150° C. and then laminated, on both sides thereof, with the photosensitive composition film obtained as mentioned above after preliminary peeling off of the polyethylene cover film, while bringing in contact with a roll set at 70° C., using a vacuum laminater. After cooling the substrate thus laminated, a negative photomask for photographically forming via holes was placed on the polyester base film and the photosensitive film composition was exposed to light at 600 mJ/cm$^2$ using an ultrahigh-pressure mercury lamp exposure apparatus. The polyester base film was peeled off from the photosensitive film composition and the unexposed portions were dissolved in a 1% aqueous solution of sodium carbonate for developing. After washing with water, the substrate was dried, for removing moisture, in a drying oven set at 80° C. for 10 minutes. This substrate was heat-cured in a drying oven at 150° C. for 90 minutes. There were found photographically formed via holes having a good cylindrical shape with a diameter of about 100 µm.

The surface of the heat-cured photosensitive film composition was conditioned by buffing off about 5 µm and then subjected to solvent swelling and chemical etching by the conventional desmearing treatment technique and further to electroless plating, whereupon a copper foil about 0.2 µm in thickness was formed. The copper foil was subjected to electric copper plating and thus a plated copper layer about 20 µm in total thickness was obtained.

A photosensitive etch resist (Photo ED System P-1000, product of Nippon Paint) was formed on the copper plating, then light exposure was performed using a pattern mask for copper circuit formation, followed by developing, etching and resist peeling off, whereby a second layer conductor pattern was formed on the photosensitive film composition. The photosensitive film composition lamination step and subsequent steps are repeated in the same manner as mentioned above to thereby form a third layer conductor pattern. Thereafter, a solder resist was applied thereto. Thus was produced a multilayer circuit board comprising a total of 6 layers. The conduction between the circuits was perfect.

Separately, test boards were produced by increasing the total copper plating thickness to 35 µm in the step of copper plating following surface adjustment of the photosensitive film composition. Cuts were made on the plated copper foil with a width of 10 mm. The adhesion strength between the plated copper foil and photosensitive film composition was measured by peeling off at 90° on a tensile tester and found to be 1000 g/cm.

Further, separately, a comb-shaped IPC pattern was formed by etching the plated copper foil on the photosensitive film composition and then, repeating the step of laminating the photosensitive film composition and the subsequent steps in the same manner, a comb-shaped IPC pattern quite identical to that in the underlying layer was formed in the overlying layer as well without photographically making via holes through the photosensitive film composition so that the comb patterns lay on top of each other. A solder resist was applied onto the pattern in the uppermost layer and then a direct-current voltage of 30 V was applied to the upper layer and lower layer comb-shaped patterns and the board in that state was set on a pressure cooker tester adjusted to 121° C., 2 atm. and 85% RH and insulation reliability testing was performed. The resistance between the upper and lower layers was initially $3 \times 10^{13}$ Ω and, after the lapse of 250 hours, the resistance was $6 \times 10^6$ Ω. These data indicated that the insulation reliability was quite problem-free from the practical viewpoint.

Example 5

A photosensitive film composition containing about 10% by weight of the organic solvents remaining therein was prepared by following the procedure of Example 4 except that the drying time in the step of preparing the film-form photosensitive film composition was reduced to about 50 seconds.

A glass-epoxy insulating material with a conductor pattern preliminarily formed thereon was heated by passing through an externally heated roll set at 150° C. and then laminated, on both sides thereof, with the photosensitive composition film obtained as mentioned above after preliminary peeling off of the polyethylene cover film, while bringing in contact with a roll set at 40° C., using a vacuum laminater. After cooling the substrate thus laminated, a negative photomask for photographically forming via holes was placed on the polyester base film and the photosensitive film composition was exposed to light at 600 mJ/cm$^2$ using an ultrahigh-pressure mercury lamp exposure apparatus. The polyester base film was peeled off from the photosensitive film composition and said composition was dried in a drying oven set to 80° C. for 30 minutes for removing the organic solvent. The unexposed portions were dissolved using a 1% aqueous solution of sodium carbonate for developing. After washing with water, the substrate was dried, for removing moisture, in a drying oven set at 80° C. for 10 minutes. This substrate was heat-cured in a drying oven at 150° C. for 90 minutes. There were found photographically formed via holes having a good cylindrical shape with a diameter of about 100 μm. The subsequent steps were conducted exactly in the same manner as in Example 4 and a 6-layer circuit board was obtained.

The results of testing for peeling strength of the plated copper foil and photosensitive film composition and of insulation reliability testing were substantially the same as those obtained in Example 4.

We claim:

1. A method of producing multilayer circuit boards characterized in that it comprises repeating a procedure comprising the steps of (1) laminating a photosensitive film composition shaped in a film-form onto an insulating material carrying a conductor pattern formed thereon, (2) exposing the laminated photosensitive film composition to light through a negative type photomask, (3) dissolving the domains not irradiated in the above exposure step, (4) heat-curing the domains not dissolved in step (3), (5) forming a copper plating layer on the surface of the photosensitive film composition heat-cured in step (4) by electroless copper plating, and (6) forming, on the plated copper layer formed in step (5), a photosensitive etch resist layer and subjecting said layer to light exposure through a photomask having a circuit pattern drawn thereon, developing and etching to thereby form a conductor pattern, said photosensitive film composition for lamination containing at least 50% by weight of a bithenol-epichlorohydrin type resin containing photosensitive functional groups and heat-curable functional groups.

2. A method of producing multilayer circuit boards characterized in that it comprises repeating a procedure comprising the steps of (1) laminating a photosensitive film composition shaped in a film-form onto an insulating material carrying a conductor pattern formed thereon, (2) exposing the laminated photosensitive film composition to light through a negative type photomask, (3) dissolving the domains not irradiated in the above exposure step, (4) heat-curing the domains not dissolved in step (3), (5) forming a copper plating layer on the surface of the photosensitive film composition heat-cured in step (4) by electroless copper plating and further forming thereon a plated copper layer by electrodeposition, and (6) forming, on the plated copper layer formed in step (5), a photosensitive etch resist layer and subjecting said layer to light exposure through a photomask having a circuit pattern drawn thereon, developing and etching to thereby form a conductor pattern, said photosensitive film composition for lamination containing at least 50% by weight of a bisphenol-epichlorohydrin type resin containing photosensitive functional groups and heat-curable functional groups.

3. The improvement of claim 1 wherein said photosensitive film composition contains an inorganic filler.

4. The improvement of claim 1 wherein said bisphenol-epichlorohydrin type resin has a weight average molecular weight of 3000 to 20,000 and contains (meth)acryloyl groups as the photosensitive functional groups.

5. The improvement of claim 1 wherein said bisphenol-epichlorohydrin type resin contains 0.5 to 4 moles per kilogram of (meth)acryloyl groups as photosensitive functional groups and 0.5 to 2 moles per kilogram of carboxyl groups as heat-curable functional groups.

6. The improvement of claim 1 wherein said bisphenol-epichlorohydrin type resin has a weight average molecular weight of 8000 to 40,000 and contains chalcone as photosensitive functional groups.

7. The improvement of claim 1 wherein said bisphenol-epichlorohydrin type resin contains 0.1 to 1 mole per kilogram of chalcone as photosensitive functional groups and 0.5 to 1.5 moles per kilogram of epoxy groups as heat-curable functional groups.

8. The improvement of claim 6 wherein said photosensitive film composition contains 10 to 30% by weight of an organic solvent.

9. A method of producing multilayer circuit boards characterized in that it comprises repeating a procedure comprising the steps of (1) laminating a photosensitive film composition shaped in a film form onto an insulating material carrying a conductor pattern formed thereon, (2) exposing the laminated photosensitive film composition to light through a negative type photomask, (3) dissolving the domains not irradiated in the above exposure step, (4) heat-curing the domains not dissolved in step (3), (5) forming a copper plating layer on the surface of the photosensitive film composition heat-cured in step (4) by electroless copper plating, and (6) forming, on the plated copper layer formed in step (5), a photosensitive etch resist layer and subjecting said layer to light exposure through a photomask having a circuit pattern drawn thereon, developing and etching to thereby form a conductor pattern, said photosensitive film composition for lamination containing at least 50% by weight of a bisphenol-epichlorohydrin type resin containing chalcone as photosensitive functional groups and epoxy groups as the heat-curable functional groups and 10 to 30% by weight of an organic solvent, and after step (2) and prior to step (3), said organic solvent being evaporated from the photosensitive film composition at a temperature lower than the heat-curing temperature for the photosensitive film composition.

10. A method of producing multilayer circuit boards characterized in that it comprises repeating a procedure comprising the steps of (1) laminating a photosensitive film composition shaped in a film form onto an insulating material carrying a conductor pattern formed thereon, (2) exposing the laminated photosensitive film composition to light through a negative type photomask, (3) dissolving the domains not irradiated in the above exposure step, (4) heat-curing the domains not dissolved in step (3), (5) forming a copper plating layer on the surface of the photosensitive film composition heat-cured in step (4) by electroless copper plating and further forming thereon a plated copper layer by electrodeposition, and (6) forming, on the plated copper layer formed in step (5), a photosensitive etch resist layer and subjecting said layer to light exposure through a photomask having a circuit pattern drawn thereon, developing and etching to thereby form a conductor pattern, said photosensitive film composition for lamination containing at least 50% by weight of a bisphenol-epichlorohydrin type resin containing chalcone as photosensitive functional groups and epoxy groups as the heat-curable functional groups and 10 to 30% by weight of an organic solvent, and after step (2) and prior to step (3), said organic solvent being evaporated from the photosensitive film composition at a temperature lower than the heat-curing temperature for the photosensitive film composition.

11. The improvement of claim 2 wherein said photosensitive fill composition contains an inorganic filler.

12. The improvement of claim 2 wherein said bisphenol-epichlorohydrin type rein has a weight average molecular weight of 3000 to 20,000 and contains (meth)acryloyl groups as the photosensitive functional groups.

13. The improvement of claim 2 wherein said bisphenol-epichlorohydrin type resin contains 0.5 to 4 moles per kilogram of (meth)acryloyl groups as photosensitive functional groups and 0.5 to 2 moles per kilogram of carboxyl groups as heat-curable functional groups.

14. The improvement of claim 2 wherein said bisphenol-epichlorohydrin type resin has a weight average molecular weight of 8000 to 40,000 and contains chalcone as photosensitive functional groups.

15. The improvement of claim 2 wherein said bisphenol-epichlorohydrin type resin contains 0.1 to 1 mole per kilogram of chalcone as photosensitive functional groups and 0.5 to 1.5 moles per kilogram of epoxy groups as heat-curable functional groups.

16. The improvement of claim 15 wherein said photosensitive film composition contains 10 to 30% by weight of an organic solvent.

17. The improvement of claim 7 wherein said photosensitive film composition contains 10 to 30% by weight of an organic solvent.

18. The improvement of claim 14 wherein said photosensitive film composition contains 10 to 30% by weight of an organic solvent.

* * * * *